United States Patent [19]
Li et al.

[11] Patent Number: 5,455,836
[45] Date of Patent: Oct. 3, 1995

[54] OPTICAL Q-SWITCHING TO GENERATE ULTRA SHORT PULSES IN DIODE LASERS

[75] Inventors: Guo P. Li, Ottawa; Toshi Makino, Nepean; Rongqing Hui, Ottawa, all of Canada

[73] Assignee: Northern Telecom Limited, Montreal, Canada

[21] Appl. No.: 346,939

[22] Filed: Nov. 23, 1994

[51] Int. Cl.$^6$ .................................................. H01S 3/11
[52] U.S. Cl. .................. 372/25; 372/10; 372/75; 372/96
[58] Field of Search .................. 372/10, 23, 25, 372/26, 30, 44, 75, 96

[56] References Cited

U.S. PATENT DOCUMENTS

| | | | |
|---|---|---|---|
| Re. 34,192 | 3/1993 | Baer | 372/10 |
| 4,641,312 | 2/1987 | Schäfer et al. | 372/25 |
| 4,696,009 | 9/1987 | Süse et al. | 372/25 |
| 5,265,115 | 11/1993 | Amano | 372/75 |
| 5,283,801 | 2/1994 | Mecherle | 372/94 |
| 5,317,447 | 5/1994 | Baird et al. | 359/328 |

OTHER PUBLICATIONS

"Mechanisms of Fast Self Pulsations in Two-Section DFB Lasers", Wenzel et al, Institut für Angewandte Analysis und Stochastik Berlin, Germany, Jul. 27, 1994, pp. 1–28.

"Improving Pulses From 2-Contact Self-Pulsating DFB Semiconductor Lasers", Lowery, et al., Photonics Research Laboratory, Dept. of Electrical and Electronic Engineering, University of Melbourne, Parkville, VIC 3052, Australia, 1994 pp. 103–104 (no month).

"12 GHz to 64 GHz Continuous Frequency Tuning in Selfpulsating 1.55 um Quantum Well DFB Lasers", Feiste, et al, Heinrich-Hertz-Institut für Nachrichtentechnik Berlin GmbH, Berlin, Germany, 1994, pp. 227–228 (no month).

*Primary Examiner*—John D. Lee
*Attorney, Agent, or Firm*—George MacGregor

[57] ABSTRACT

A system for generating an ultra short optical pulse by pumping a semiconductor signal laser with an optical pulse from a semiconductor probe laser. The signal laser has dual segments each operated under different d.c. injection current levels. The probe laser is modulated with a pulsed input and the optical output thereof is coupled via optical means to the signal laser so as to Q-switch the latter. Optical pulses in the 65 ps range result.

16 Claims, 5 Drawing Sheets

OPTICAL Q-SWITCHING TO GENERATE ULTRA SHORT PULSES IN DIODE LASERS

FIELD OF THE INVENTION

This invention relates to semiconductor lasers and more particularly to a system wherein a semiconductor laser is Q-switched optically by a second semiconductor laser to generate an ultra short pulse.

BACKGROUND OF THE INVENTION

In the telecommunications industry, there is an on-going requirement to increase the transmission bandwidth so as to allow the delivery of greater communication services such as video, and high density computer data. Single mode optical fibers are known to be an ideal medium for the transmission of wide bandwidth data and, consequently, transmission systems specifically designed to take advantage of this property are continually being developed. Such systems include wavelength division multiplexing (WDM) and time division multiplexing (TDM) photonic networks. In return to zero (RZ) coding and pulse position coding (PPC) the shorter the pulse width of the data train the shorter the time slot and hence the greater the overall capacity of the TDM systems.

Further, in optical information processing and optical computing systems shortening the bit length in the time axis can speed up the processing or computing. It may also provide processing accuracy through precise signal triggering by the short pulses.

The present invention relates to a system wherein ultra short pulses are generated optically by utilizing the output of one semiconductor laser to effect Q-switching of another semiconductor laser. In addition, the system is capable of wavelength conversion between the wavelengths of the two lasers.

PRIOR ART

It is known to Q-switch solid state lasers with the output of semiconductor laser diodes in order to increase peak power output and/or decrease pulse width.

In reissue U.S. Pat. No. 34,192 dated Mar. 9, 1993 (T. M. Baer) a laser diode is used to end pump a rod of Nd:YAG or Nd:YLF to produce an output pulse having a pulse width in the order of 50 ns.

In U.S. Pat. No. 5,265,115 which issued Nov. 23, 1993 to Amano, a semiconductor laser is used to pump a solid state laser medium in a laser resonator. The combination is used to keep the intensity of an output laser beam substantially invariable regardless of the oscillation condition.

U.S. Pat. No. 5,283,801 which issued Feb. 1, 1994 to Mecherle, discloses a system wherein a laser diode is used in an external resonant ring cavity in order to produce cavity dumping or Q-switching.

U.S. Pat. No. 5,317,447 which issued May 31, 1994 to Baird et al discloses a diode-pumped tunable solid state laser which in one embodiment provides a frequency conversion from an infrared output of the laser diodes to a visible or near ultraviolet output.

None of the prior art of which Applicants are aware utilizes a specially designed multi-segment diode laser which is optically Q-switched by a diode probe laser in order to generate ultra short output pulses.

SUMMARY OF THE INVENTION

It is an object of the present invention to provide a system in which a diode laser is optically Q-switched by another diode laser.

It is a further object of the invention to provide a width compressed short optical pulse in the order of 65 ps (FWHM) by pumping light from a probe laser into a specially designed signal laser.

It is a still further object of the invention to provide a wavelength conversion by pumping a signal laser having an output of a first wavelength with light of a second wavelength from a probe laser. In practice the conversion is in the range 5–50 nm while in principle it is only limited by the gain spectrum.

Therefore in accordance with a first aspect of the present invention there is provided a system for optically generating a short width optical pulse. The system has a first distributed feedback (DFB) semiconductor laser (signal laser) having a multi-quantum-well (MQW) active region to produce a laser output of a first wavelength in response to an injected current, the first laser having a common contact of one polarity and a pair of isolated contacts of the opposite polarity. Means are provided to separately supply injection current to each one of the pair of isolated contacts. The system also has a second DFB laser (probe laser) which has an active region to produce a laser output of a second wavelength in response to an injection current supplied to a contact thereon. In a preferred embodiment the second wavelength is longer than the first. A modulating input current is provided to the second laser by appropriate supply means. Optical transfer means which in a preferred embodiment comprises a single mode fiber, isolator, tunable attenuator, polarization controller and fiber coupler, is used to couple light from the active region of the second laser to the active region of the first laser.

In accordance with a second aspect of the invention there is provided a method of generating a short width optical pulse (e.g., 65 ps) by Q-switching a signal laser with the light from a probe laser. According to the method a DFB semiconductor signal laser having a MQW active area is operated by supplying separately controllable bias current to a pair of isolated contacts of one polarity on the device in order to generate an output of a first wavelength. A second DFB diode laser is operated with a modulating current in order to produce an output of a second wavelength. Preferably the second wavelength is longer than the first. The output of the second laser is optically coupled to a cavity of the first in order to provide a Q-switching function.

DESCRIPTION OF THE DRAWINGS

The invention will now be described in greater detail with reference to the appended drawings wherein.

DETAILED DESCRIPTION OF THE INVENTION

Figure 1:
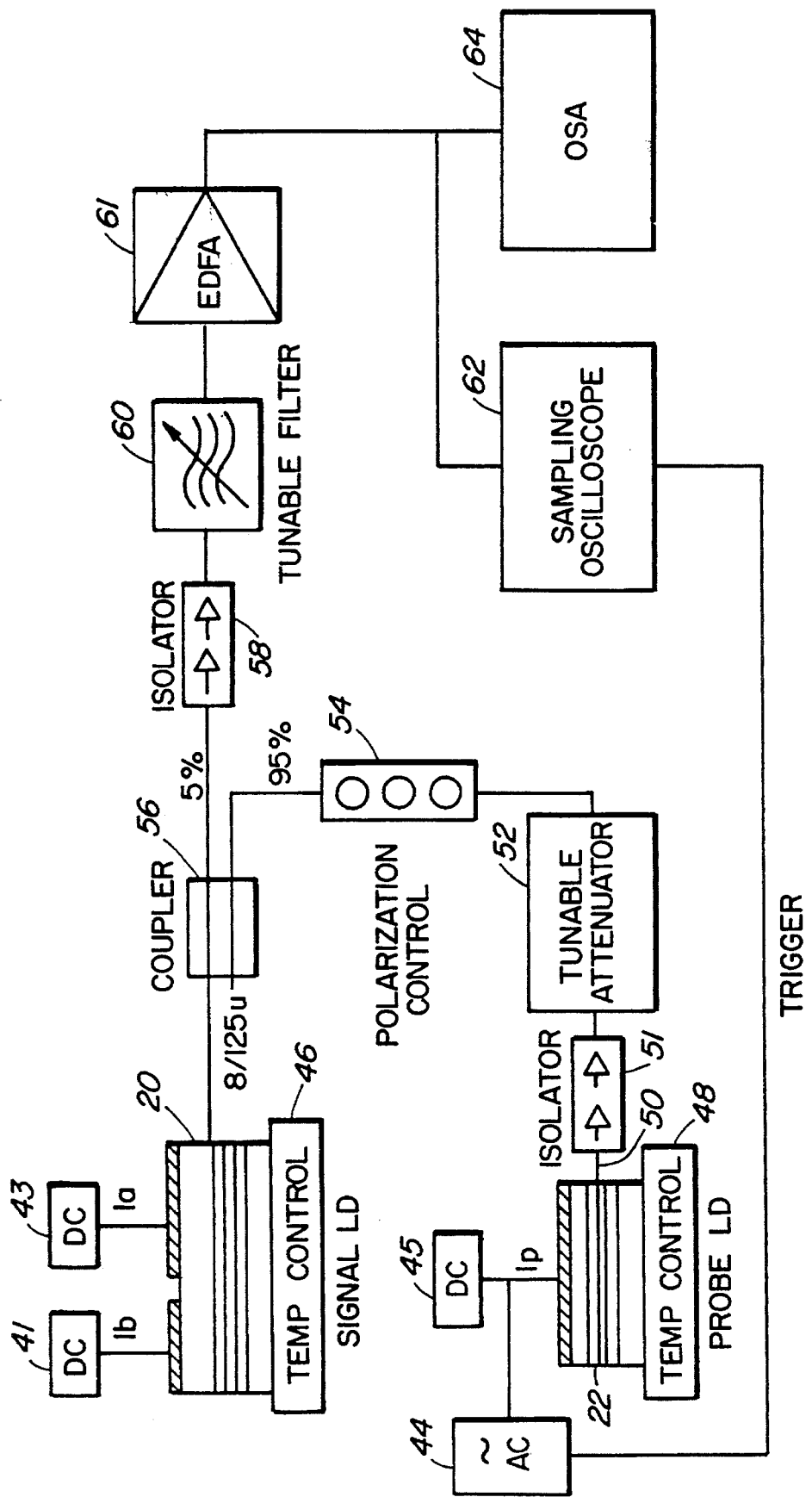
FIG. 1 is a block diagram of the laser system according to the invention.

FIG. 1 illustrates in block form the various elements in the preferred embodiment of the invention. These elements include signal laser 20 and probe laser 22. For a better understanding of the signal laser, reference may be made to FIG. 2. The signal laser 20 in a preferred embodiment is based on the InGaAsP/InP system and the MOCVD growth procedure. It is to be understood, however, that other semiconductor materials and growth techniques may be used in the preparation of both signal and probe lasers. For example, the quantum well structure may incorporate InGaAs in which case the III-V alloy system may be defined as InGaAs/InGaAsP/InP.

Figure 2:
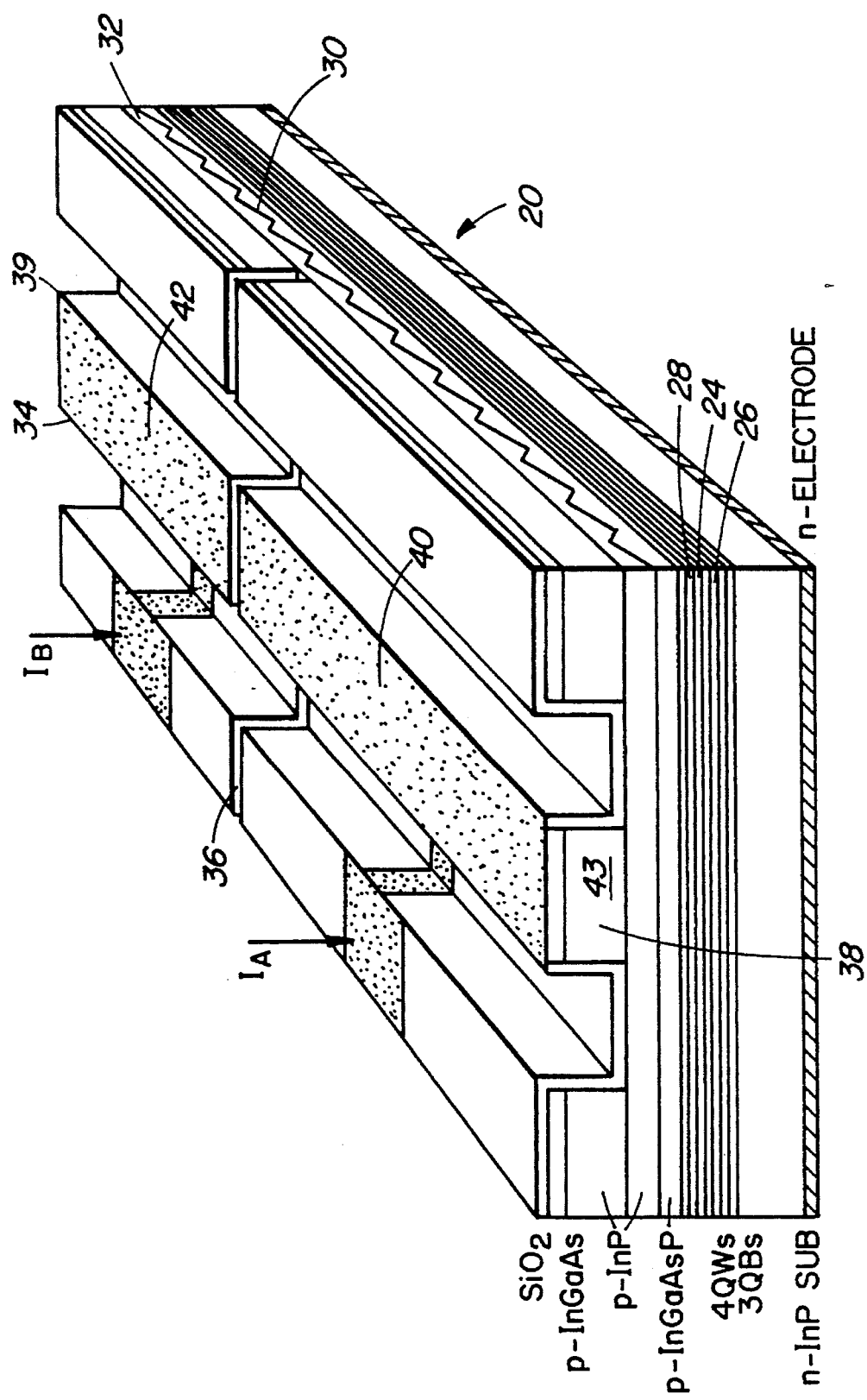
FIG. 2 is a perspective view of the signal laser.

As illustrated in FIG. 2, signal laser 20 has multi-quantum-well active region 24 consisting of four 5.5 nm thick 1.5% compressively strained InGaAsP quantum wells 26 and three unstrained InGaAsP ($\lambda g=1.25$ μm) barriers 28. Again, this is exemplary only and the invention is not limited to such a structure. A first order grating 30 for the index coupling with a depth of approximately 65 nm was formed in p-type InGaAsP layer 32. The grating was formed by photolithography and wet chemical etching. A p-type InP layer is grown on top of the grating followed by a p-type InGaAs contact layer. A ridge waveguide structure 34 is formed in the structure for lateral optical confinement.

$SiO_2$ and Au/Cr are employed to form p-type contacts as is well known in the prior art. An n-type contact is formed on the InP substrate side.

Figure 3:
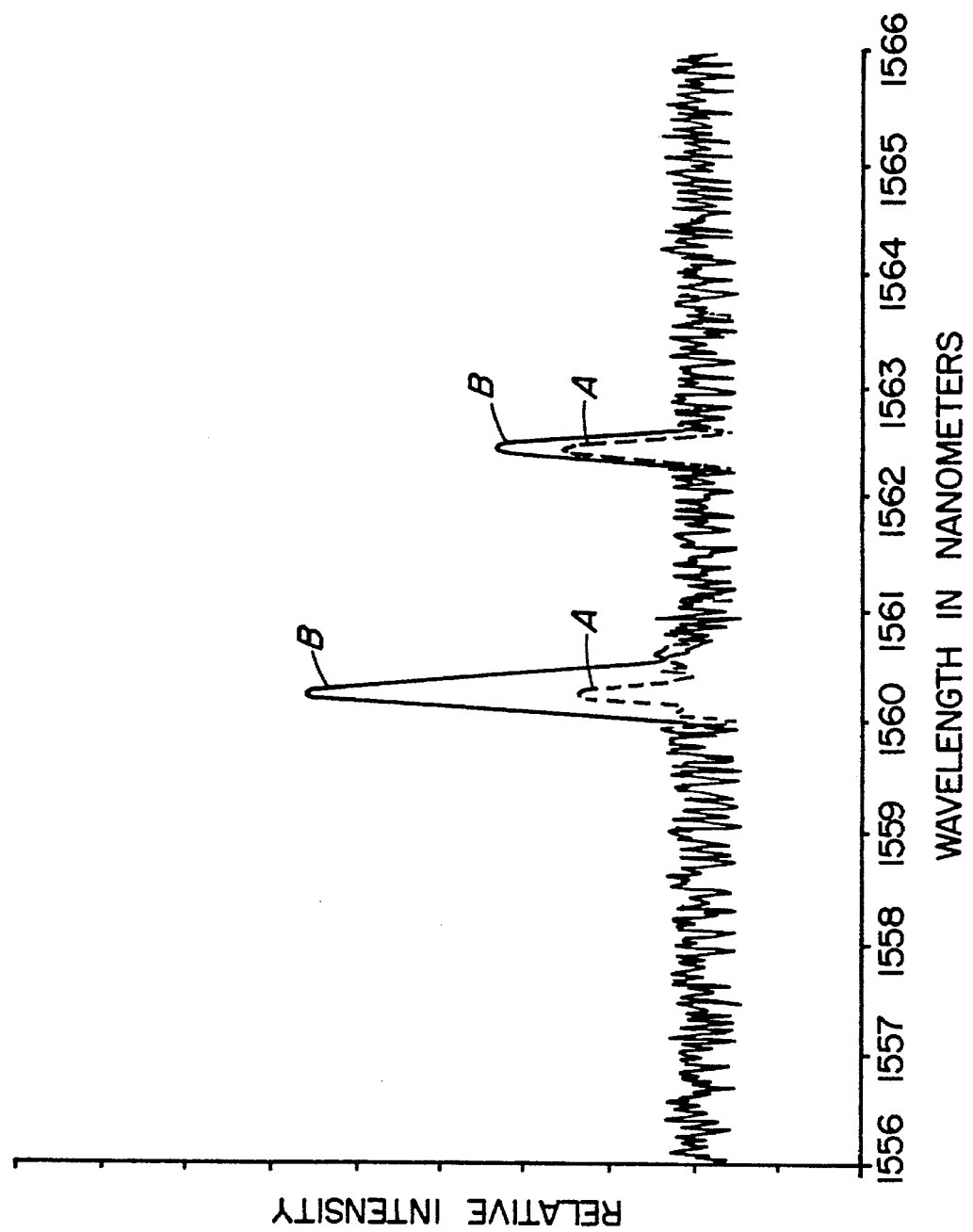
FIG. 3 illustrates the wavelength characteristics of the signal laser operating with and without optical input from the probe laser.

The ridge waveguide 34 was partitioned by ion reactive etching channel 36 thereby creating a pair of segments 38 and 39 having isolated contacts 40, 42 respectively. In the exemplary embodiment discussed herein segments 38 and 39 are 240 μm and 120 μm long respectively. Ridge waveguide 34 has a nominal width of 2 μm. The facet 43 of segment 38 was coated with 5% anti reflectivity and used as the front facet. The isolation resistance between segments 38 and 39 was approximately 800Ω. The resistance stated is by way of example only and the invention is not limited to this value; a resistance greater than 200Ω is considered adequate. The wavelength of laser 20 was approximately 1563 nm as shown in FIG. 3. In this figure, waveform A illustrates the wavelength peaks with optical injection from probe laser 22 while waveform B shows the relative peaks without any optical input from the probe laser.

Probe laser 22 preferably has a distributed feedback (DFB) structure with grating 30 but without segmented waveguide. The wavelength of laser 22 was approximately 1580 nm.

As shown in FIG. 1 the signal laser 20 is provided with separately controlled d.c. current via supplies 41, 43 to both contacts 40, 42. Probe laser 22 is supplied with a d.c. bias current from supply 45 and a modulating component provided by an a.c. controller 44. Both laser 20 and 22 are temperature controlled with Peltier devices 46 and 48 respectively.

The output of probe laser 22 is coupled to signal laser 20 through single mode optical fiber 50 via an isolator 51, a tunable attenuator 52, polarization control 54, and fiber coupler 56. The coupler 56 has 5% and 95% output ends as indicated in FIG. 1. The output of signal laser 20 through coupler 56 is transferred to optical isolator 58, and through tunable wavelength filter 60 and magnified by an erbium doped fiber amplifier (EDFA) 61. The waveform of the signal is measured with a sampling oscilloscope 62 equipped with a 22 GHz converter/sampling head. Wavelengths of optical signals are monitored with an optical spectrum analyzer 64.

Figure 4:
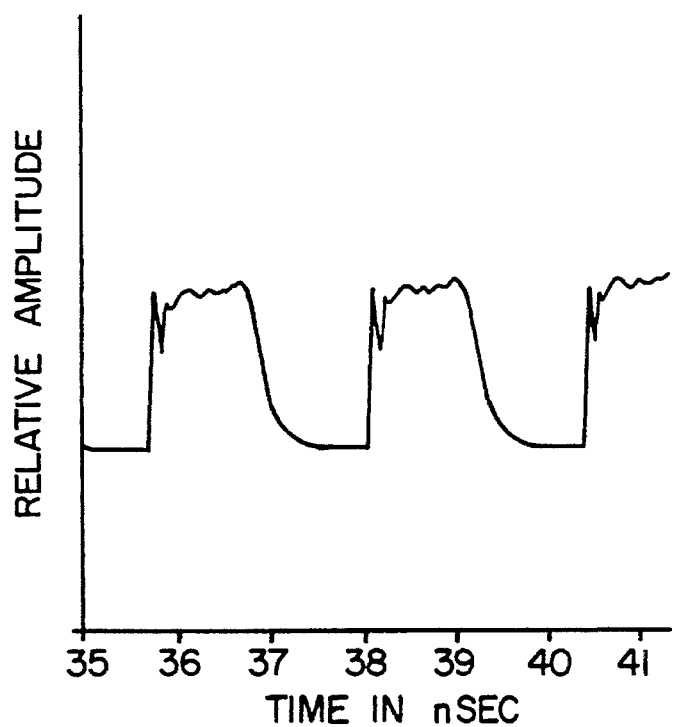
FIG. 4 is the output waveform of the probe laser.

In the set-up discussed herein, probe laser 22 is modulated at a 500 Mbit/s rate with a 50% duty cycle giving an optical output signal shown by the waveform of FIG. 4. The signal laser 20 is operated under CW conditions with different injection current levels supplied to the isolated p-type contacts.

Figure 5:
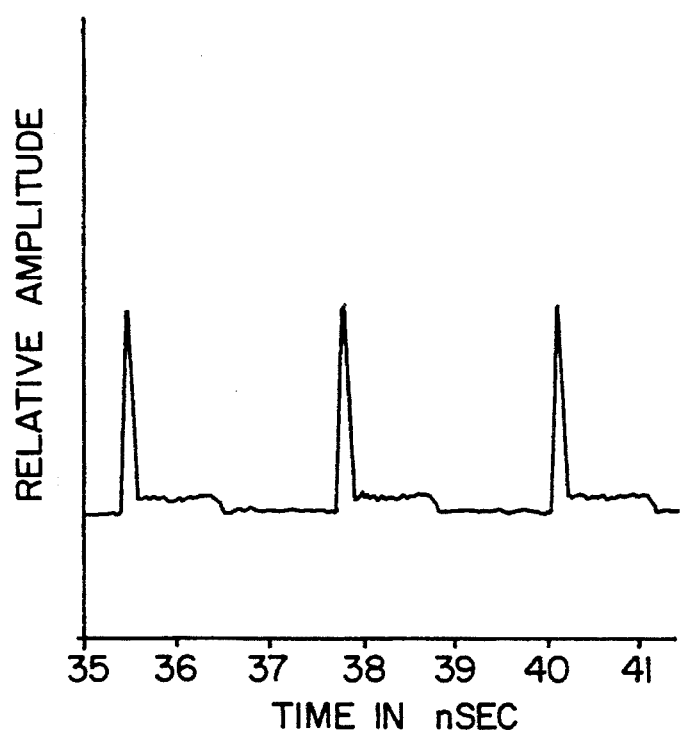
FIG. 5 is the output waveform of the signal laser as pumped with the waveform of FIG. 4.
Figure 6:
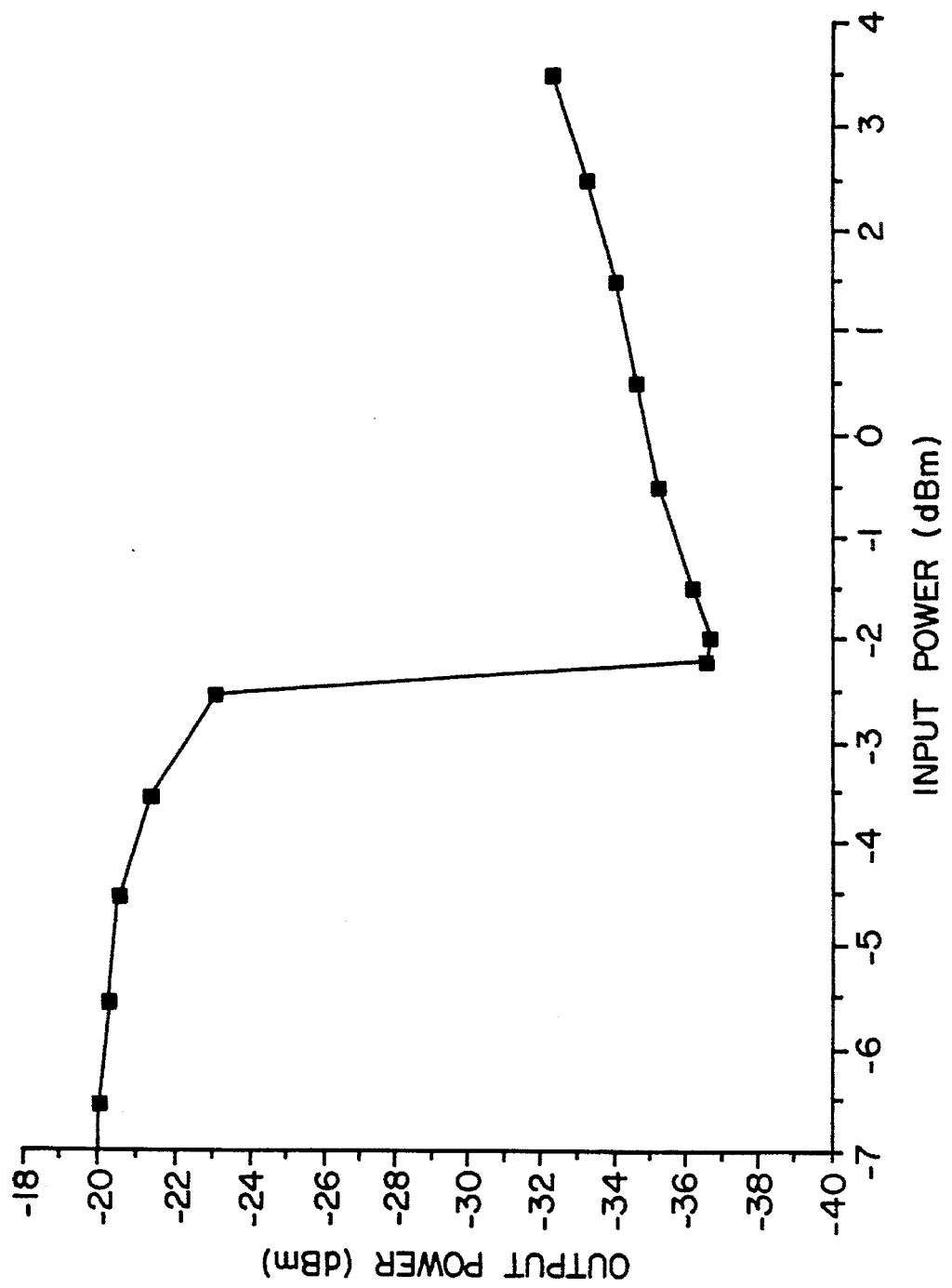
FIG. 6 shows graphically the output power dependence of the signal laser upon the input power.

The drive conditions for the signal laser in order to accomplish the results reported herein were 42 mA for segment 38 and 28 mA for segment 39. The operating temperature was 25.15° C. As discussed previously these values are exemplary only and not intended to be limiting. Under these conditions the output of the signal laser switches from the 50% duty cycle of the probe laser to the narrow pulse shown in the waveform of FIG. 5. The output pulse width is measured at 65 ps (FWHM) while the falling time of the input pulse was about 200 ps. The system's dominant wavelength switched from the 1563 nm signal laser output to 1580 nm, which is the wavelength of the probe laser.

The foregoing results are explained as follows. When the signal laser is pumped at certain levels above threshold both the optical gain and the phase for a signal wave making a round trip in the cavity can be controlled by an external optical signal. If the signal laser is designed to have a large wavelength detuning from the gain peak, one has to pump more carriers to satisfy the lasing condition. This, on the other hand, can amplify the probe laser light injected from outside. Because the probe light shares the carriers (optical gain) with the original signal light, the presence of the probe light can quickly decrease the Q value of the overall laser cavity and lead to an optical Q-switching. It is believed that the narrow pulse width is due both to the MQW laser structure and the multiple Bragg modes in the two-segment DFB signal laser 20. In a MQW structure carrier life time is normally smaller and the carriers are predominantly localized in the wells as compared to its bulk counterpart. Thus, even though the laser bias level approached threshold during the Q-switching process it was still possible to observe a short width pulse with high sensitivity. The multiple Bragg modes contribute to the effect in as much as, when the probe laser signal turns off, the existence of other longitudinal modes enhance the operation speed by gain enhancement because the device is always operating in an 'on' state. These modes can become either stronger or weaker depending on the new phase conditions in the cavity.

The system of the present invention has several advantages over the prior art techniques for generating short pulses. Firstly the system is completely optical, thus avoiding limitations inherent in traditional electronic switching networks. Secondly the wavelength is convertible, i.e., the output wavelength is different than the input wavelength. Further, because of optical triggering the restrictions in modulation speed imposed by parasitics is relaxed. Since no electrical to optical conversion components are required the system is more cost efficient. Finally, the system provides a simple technique of generating pulse compression.

Although a particular embodiment of the invention has been illustrated and described it will be apparent to one skilled in the art that changes to the system can be made. It is anticipated, however, that such changes will fall within the scope of the invention as defined by the following claims.

We claim:

1. A system for optically generating short width optical pulses comprising:

a first semiconductor DFB laser having a MQW active region to produce a laser output of a first wavelength in response to an injected current, said first laser having a common contact of one polarity and pair of isolated contacts of an opposite polarity;

means to provide separately adjustable injection current to each one of said pair of isolated contacts;

a second semiconductor DFB laser having an active region to produce a laser output of a second wavelength, said second wavelength being longer than said first;

means to provide a modulated input current to said second laser; and optical transfer means between the active region of said first laser and the active region of said second laser whereby the first laser is pumped with the modulated output of the second.

2. The system as defined in claim 1, the first and second semiconductor lasers being prepared from a III-V alloy material.

3. The system as defined in claim 2, the III-V alloy material being InGaAsP/InP.

4. The system as defined in claim 3, the first DFB laser having a ridge waveguide for lateral optical confinement.

5. The system as defined in claim 4, the ridge waveguide having a transverse channel through the contact to form first and second isolated segments.

6. The system as defined in claim 5, the electrical resistance between the pair of isolated segments being greaer than 200Ω.

7. The system as defined in claim 6 the first isolated segment being larger than the second with the free face of the first segment providing the output.

8. The system as defined in claim 7, the difference between the first wavelength and the second wavelength being in the range 5 to 50 nm.

9. The system as defined in claim 7 the free face of the first segment having an antireflective coating.

10. The system as defined in claim 4, the first DFB laser having a first order grating between the MQW and the ridge waveguide, the first order grating providing multiple Bragg modes.

11. The system as defined in claim 2, the III-V alloy material being InGaAs/InGaAsP/InP.

12. The system as defined in claim 1, the first and second lasers having means to control the temperature thereof.

13. A method of generating an ultra short optical pulse by Q-switching a DFB dual segment signal laser having an MQW with the optical output of a probe DFB laser, the method comprising:

operating the signal laser with first and second separately controllable injection current levels to each of said dual segments to generate an output of a first wavelength;

operating a probe DFB laser with a modulating current to produce optical pulses of a second wavelength; and coupling the optical pulses from the probe laser to the signal laser so as to Q-switch the signal laser.

14. The method as defined in claim 13, the second wavelength being longer than the first wavelength.

15. The method as defined in claim 14, the difference between the second wavelength and the first wavelength being in the range 5–50 nm.

16. The method as defined in claim 15, the optical pulses from the probe laser being coupled to the cavity of the signal laser.

* * * * *